(12) United States Patent
McLean (10) Patent No.: US 8,563,097 B2
(45) Date of Patent: *Oct. 22, 2013

(54) REMOTE COMBUSTION DEPOSITION BURNER AND/OR RELATED METHODS

(75) Inventor: David D. McLean, Hazel Park, MI (US)

(73) Assignee: Guardian Industries Corp., Auburn Hills, MI (US)

(*) Notice: Subject to any disclaimer, the term of this patent is extended or adjusted under 35 U.S.C. 154(b) by 1016 days.

This patent is subject to a terminal disclaimer.

(21) Appl. No.: 12/591,168

(22) Filed: Nov. 10, 2009

(65) Prior Publication Data

US 2010/0129561 A1    May 27, 2010

Related U.S. Application Data

(63) Continuation-in-part of application No. 12/000,784, filed on Dec. 17, 2007, now Pat. No. 8,440,256.

(51) Int. Cl.
*C23C 8/00* (2006.01)
*B05D 5/06* (2006.01)

(52) U.S. Cl.
USPC ........... 427/586; 427/162; 427/164; 427/165; 427/166; 427/167

(58) Field of Classification Search
None
See application file for complete search history.

(56) References Cited

U.S. PATENT DOCUMENTS

| 5,101,558 A | 4/1992 | Grob et al. |
| 5,652,021 A * | 7/1997 | Hunt et al. ................ 427/248.1 |
| 5,858,465 A | 1/1999 | Hunt et al. |
| 6,013,318 A | 1/2000 | Hunt et al. |
| 6,193,911 B1 | 2/2001 | Hunt et al. |
| 2005/0061036 A1 | 3/2005 | Mileo et al. |
| 2006/0127599 A1 | 6/2006 | Wojak |
| 2009/0155493 A1 * | 6/2009 | Lewis et al. .................. 427/586 |

FOREIGN PATENT DOCUMENTS

| DE | 78 517 | 1/1894 |
| EP | 1 602 633 | 12/2005 |
| EP | 2 072 633 | 6/2009 |
| GB | 2 292 468 | 2/1996 |

(Continued)

OTHER PUBLICATIONS

"Combustion Chemical Vapor Deposition: A Novel Thin-Film Deposition Technique", Hunt et al., 1993 American Institute of Physics, Apr. 21, 1993.

(Continued)

*Primary Examiner* — David Turocy
*Assistant Examiner* — Michael G Miller
(74) *Attorney, Agent, or Firm* — Nixon & Vanderhye P.C.

(57) ABSTRACT

Certain example embodiments relate to a burner for use in combustion deposition depositing a coating on a substrate. An infrared (IR) burner generates radiant energy in an area between the burner and the substrate. A delivery device (1) provides a stream comprising a substantially vaporized precursor and a carrier gas from a location remote from the radiant energy generated by the IR burner, and (2) causes the stream to flow between the substrate and the IR burner. The stream is substantially laminar when exiting the delivery device. The radiant energy is sufficient to cause the precursor in the stream to be combusted and to heat the substrate to allow at least a portion of the combusted precursor to form the coating, directly or indirectly, on the substrate. The burners of certain example embodiments may be used, for example, to combustion deposition deposit metal oxide coatings onto glass substrates.

10 Claims, 5 Drawing Sheets

(56) References Cited

FOREIGN PATENT DOCUMENTS

| JP | 06 221525 | 8/1994 |
|---|---|---|
| JP | 09-286636 | 4/1997 |
| WO | WO 00/44679 | 8/2000 |
| WO | WO 2004/056714 | 7/2004 |

OTHER PUBLICATIONS

"Growth of Thin Films of Molybdenum and Tungsten Oxides by Combustion CVD using Aqueous Precursor Solutions", Davis et al., Chemical Vapor Deposition 2004, 10, No. 1, pp. 29-34.

"Specifications/Design Details" Radiant Energy—source and transfer, Rad/Max Burners Sep. 2002, pp. 1403-1414.

"Metal oxide powder synthesis by the emulsion combustion Method," Tani et al., J. Mater. Res., vol. 13, No. 5, May 1998, pp. 1099-1102.

"Morphology of Oxide Particles Made by the Emulsion Combustion Method," Tani et al., J. American Ceramic Society, 2003, vol. 86, No. 6, pp. 898-904.

"Dynamics of Hollow and Solid Alumina Particle Formation in Spray Flames," Tani et al., J. American Ceramic Society, 2004, vol. 87, No. 3, pp. 523-525.

"Criteria for Flame-Spray Synthesis of Hollow, Shell-Like, or Inhomogeneous Oxides," Jossen et al., J. American Ceramic Society, 2005, vol. 88, No. 6, pp. 1388-1393.

"Liquid-fed Aerosol Reactors for One-step Synthesis of Nano-structured Particles," Mädler, KONA No. 22, 2004, pp. 107-120.

"Flame aerosol synthesis of smart nanostructured materials," Strobel et al., J. Mater. Chem., 2007, 17, pp. 4743-4756.

U.S. Appl. No. 12/155,762, filed Jun. 9, 2008.

\* cited by examiner

REMOTE COMBUSTION DEPOSITION BURNER AND/OR RELATED METHODS

CROSS-REFERENCE TO RELATED APPLICATION

This application is a continuation-in-part of application Ser. No. 12/000,784 filed Dec. 17, 2007 now U.S. Pat. No. 8,440,256, the entire contents of which is hereby incorporated herein by reference.

FIELD OF THE INVENTION

Certain example embodiments of this invention relate to the deposition of thin film coatings onto substrates via remote combustion deposition. More particularly, certain example embodiments relate to a burner design that enables a precursor to be delivered along with a carrier gas stream to the reaction zone external to or remote from the flame(s). In certain example embodiments, a distribution device provides an at least initially substantially laminar flow of a gaseous stream comprising the precursor and the carrier gas, which ultimately is substantially uniform across the coat zone.

BACKGROUND AND SUMMARY OF EXAMPLE EMBODIMENTS OF THE INVENTION

Reagent concentration, temperature, and residence time are known factors that drive chemical reactions. Combustion chemical vapor deposition (combustion CVD) processes are no different. The significance of these factors and their controlling process parameters has been well documented.

Combustion chemical vapor deposition (combustion CVD) is a relatively new technique for the growth of coatings. Combustion CVD is described, for example, in U.S. Pat. Nos. 5,652,021; 5,858,465; and 6,013,318, each of which is hereby incorporated herein by reference in its entirety.

Conventionally, in combustion CVD, precursors are dissolved in a flammable solvent and the solution is delivered to the burner where it is ignited to give a flame. Such precursors may be vapor or liquid and fed to a self-sustaining flame or used as the fuel source. It will be appreciated that when used with a self-sustaining flame, a solvent may or may not be required. A substrate is then passed under the flame to deposit a coating.

There are several advantages of combustion CVD over traditional pyrolytic deposition techniques (such as CVD, spray and sol-gel, etc.). One advantage is that the energy required for the deposition is provided by the flame. A benefit of this feature is that the substrate typically does not need to be heated to temperatures required to activate the conversion of the precursor to the deposited material (e.g., a metal oxide). Also, a curing step (typically required for spray and sol-gel techniques) typically is not required. Another advantage is that combustion CVD techniques do not necessarily require volatile precursors. If a solution of the precursor can be atomized/nebulized sufficiently (e.g., to produce droplets and/or particles of sufficiently small size), the atomized solution will behave essentially as a gas and can be transferred to the flame without requiring an appreciable vapor pressure from the precursor of interest.

Conventional combustion CVD processes involve passing a precursor material directly through the entire length of the flame by inserting it into the combustion gas stream prior to being combusted. In some conventional techniques, a precursor/solvent solution is used as the fuel source. The temperature and residence time profile experienced by the precursor is controlled by the combustion conditions and/or burner-to-substrate distance. Unfortunately, however, these control mechanisms can be fairly limited, depending on the particular application.

It will be appreciated that combustion deposition techniques may be used to deposit metal oxide coatings (e.g., singly-layer anti-reflective coatings) on glass substrates, for example, to alter the optical properties of the glass substrates (e.g., to increase visible transmission). To this end, conventional combustion deposition techniques were used by the inventor of the instant application to deposit a single layer anti-reflective (AR) film of silicon oxide (e.g., $SiO_2$ or other suitable stoichiometry). The attempt sought to achieve an increase in light transmission in the visible spectrum (e.g., wavelengths of from about 400-700 nm) over clear float glass with an application of the film on one or both sides. The clear float glass used in connection with the description herein is a low-iron glass known as "Extra Clear," which has a visible transmission typically in the range of 90.3% to about 91.0%. Of course, the examples described herein are not limited to this particular type of glass, or any glass with this particular visible transmission.

Figure 1A:
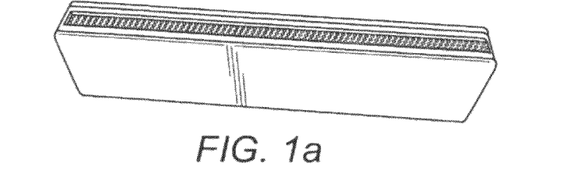
FIG. 1a shows a typical linear burner.
Figure 1B:
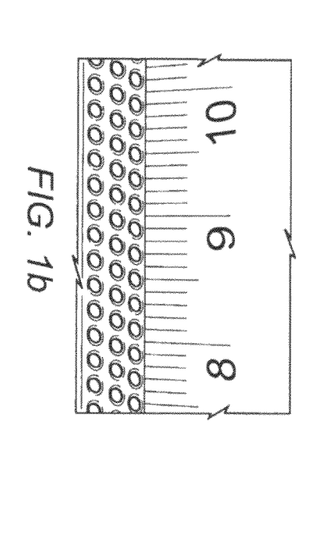

The combustion deposition development work was performed using a conventional linear burner with 465 holes even distributed in 3 rows over an area of 0.5 cm by 31 cm (155 holes per row). By way of example and without limitation, FIG. 1a shows a typical linear burner, and FIG. 1b is an enlarged view of the holes in the typical linear burner of FIG. 1a. As is conventional, the linear burner was fueled by a premixed combustion gas comprising propane and air. It is, of course, possible to use other combustion gases such as, for example, natural gas, butane, etc. The standard operating window for the linear burner involves air flow rates of between about 150 and 300 standard liters per minute (SLM), using air-to-propane ratios of about 15 to 25. Successful coatings require controlling the burner-to-lite distance to between about 10-50 mm when a linear burner is used.

Typical process conditions for successful films used a burner air flow of about 225 SLM, an air-to-propane ratio of about 19, four passes of the substrate across the burner, a burner-to-lite distance of 35 mm, and a glass substrate velocity of about 50 mm/sec.

Figure 2:
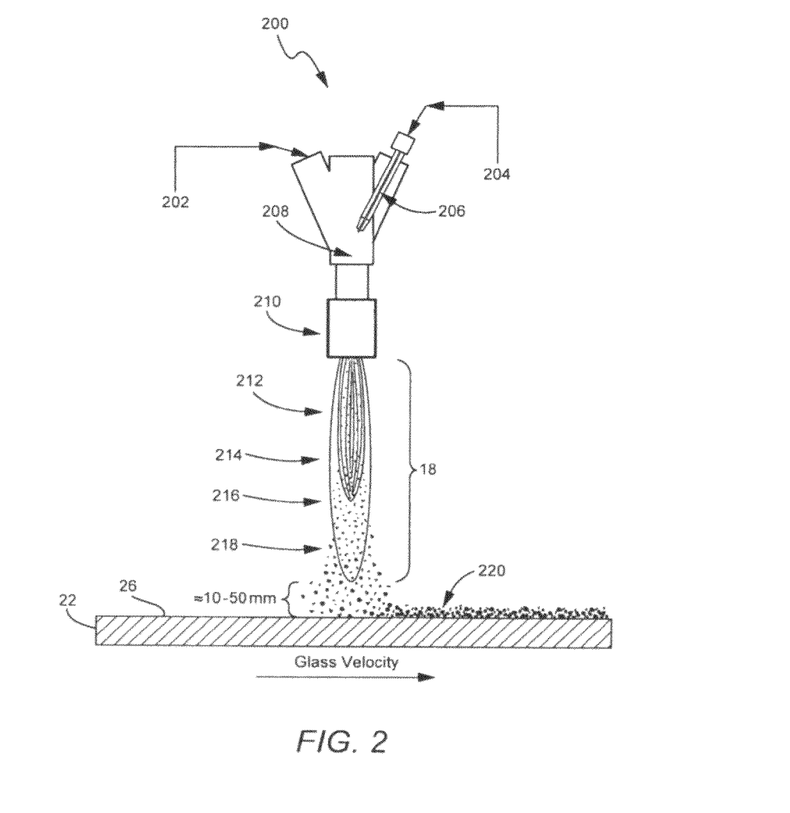
FIG. 2 is a simplified view of an apparatus including a linear burner used to carry out combustion deposition.

FIG. 2 is a simplified view of an apparatus 200 including a linear burner used to carry out combustion deposition. A combustion gas 202 (e.g., a propane air combustion gas) is fed into the apparatus 200, as is a suitable precursor 204 (e.g., via insertion mechanism 206, examples of which are discussed in greater detail below). Precursor nebulization (208) and at least partial precursor evaporation (210) occur within the apparatus 200. The precursor could also have been delivered as a vapor reducing or even eliminating the need for nebulization The flame 18 may be thought of as including multiple areas. Such areas correspond to chemical reaction area 212 (e.g., where reduction, oxidation, and/or the like may occur), nucleation area 214, coagulation area 216, and agglomeration area 218. Of course, it will be appreciated that such example areas are not discrete and that one or more of the above processes may begin, continue, and/or end throughout one or more of the other areas.

Particulate matter begins forming within the flame 18 and moves downward towards the surface 26 of the substrate 22 to be coated, resulting in film growth 220. As will be appreciated from FIG. 2, the combusted material comprises non-vaporized material (e.g., particulate matter), which is also at least partially in particulate form when coming into contact with the substrate 22. To deposit the coating, the substrate 22 may be moved (e.g., in the direction of the velocity vector). Of course, it will be appreciated that the present invention is not limited to any particular velocity vector, and that other example embodiments may involve the use of multiple apparatuses 200 for coating different portions of the substrate 22, may involve moving a single apparatus 200 while keeping the substrate in a fixed position, etc. The flame 18 is about 10-50 mm from the surface 26 of the substrate 22 to be coated.

Unfortunately, the heat flux produced during combustion deposition creates a significant increase in substrate temperature. Also, heat is delivered to a smaller area (e.g., in comparison to the IR burners of certain example embodiments described below) causing much larger temperature gradients. Furthermore, the substrate temperature increases with smaller burner-to-lite distances and increasing numbers of passes. For example, using the process conditions identified above, the back side of the substrate was found to reach a temperature of 162° C. This equates to a linear estimate of temperature rate of rise of 71° C./burner/m/min.

The substrate temperature extremes and resultant thermal gradient experienced by the glass during deposition leads to stress changes in the glass. This phenomenon, in turn, has resulted in spontaneous glass fracture during coating, in post-coating cooling, and/or in subsequent deposition of the same film on the opposite side of the lite. Additionally, the glass experiences bowing, which ultimately leads to coating uniformity issues.

Thus, it will be appreciated that there is a need in the art for combustion deposition techniques that overcome one or more of these and/or other disadvantages, and/or improved techniques for depositing metal oxide coatings (single layer anti-reflective coatings) on glass substrates via combustion deposition.

Recently, efforts have focused on investigating alternative burner designs. These efforts have led to the exploration of infrared and non-linear (e.g., two dimensional) burners produced by Maxon Corporation. One example of an IR burner design is disclosed in co-pending and commonly assigned application Ser. No. 12/000,784, filed on Dec. 17, 2007, the entire contents of which is hereby incorporated herein by reference.

Some techniques use a combustion deposition device in which the precursor is delivered independent of the flame. This approach is described in, for example, U.S. Publication No. 2005/0061036, the entire contents of which is hereby incorporated herein by reference. However, these products appear to involve substantially different burner designs and also appear to be limited to the deposition of optical preforms. Current remote CCVD (R-CCVD) efforts, such as those performed by Innovent, for example, aim for greater control over reaction conditions by delivering the precursor externally to the flame. The proposed design of certain example embodiments (described in greater detail below) improves upon this approach by utilizing IR burner technology. This provides for a substantially less turbulent reaction zone, which may provide improved coating uniformity and repeatability. Within an IR burner, combustion takes place primarily within the body of the burner before the combustion gasses exit the refractory faceplate. Additionally, IR burners of the type described herein consume less fuel and deliver heat over a substantially more planar area than conventional linear "ribbon" burners. The substantially lower flow rate of combustion gases per unit area and refractory faceplate provide for substantially less turbulent conditions at the exit of the burner, which may provide for a more controllable reaction zone, leading to improved coating uniformity and deposition repeatability. Additionally, the refractory faceplate also serves as an upper bound for the precursor containing carrier gas that is inserted between the faceplate and the glass. This has the effect of controlling the turbulence of the gasses within the reaction zone leading to greater control. It may also be possible to "tune" the primary wavelengths of IR radiation emitted from the refractory faceplate to favor certain reaction conditions through control of the combustion conditions. Indeed, the IR energy emitted from the refractory faceplate may be sufficient to promote precursor reaction and film growth. Of course, the use of an IR burner also may carry some or all of the advantages described in application Ser. No. 12/000,784 (the entire contents of which is hereby incorporated herein by reference).

In certain example embodiments, a fuel gas and oxygen source are selected and mixed together to form a combustion gas mixture. At least a portion of the combustion gas mixture is used in forming the coating. A precursor is selected such that at least a portion of the combustion products form a coating with desired properties. The precursor is introduced into the combustion gas stream to form a reagent mixture. Using at least one infrared burner, at least a portion of the reagent mixture is reacted via combustion to form reaction products, with at least a portion of the reaction products comprising non-vaporized material.

In certain example embodiments, a method of applying a coating to a substrate using combustion deposition is provided. A substrate having at least one surface to be coated is provided. A reagent (and optionally, a carrier medium) is selected, and if a carrier medium is selected, the reagent and the carrier medium are mixed together to form a reagent mixture, with the reagent being selected such that at least a portion of the reagent forms the coating. A precursor to be combusted with the reagent (or reagent mixture) is introduced, with the precursor including silicon. Using at least one infrared burner, at least a portion of the reagent (or reagent mixture) and the precursor are combusted to form a combusted material. The substrate is provided in an area so that the substrate is heated sufficiently to allow the combusted material to form the coating, directly or indirectly, on the substrate. The deposited coating comprises silicon oxide. The coating increases visible transmission of the glass substrate by at least about 1.7%.

In certain example embodiments, a method of applying a coating to a substrate using combustion deposition is provided. A substrate having at least one surface to be coated is provided. A reagent (and optionally, a carrier medium) is selected, and if a carrier medium is selected, and the reagent and the carrier medium are mixed together to form a reagent mixture, with the reagent being selected such that at least a portion of the reagent forms the coating. A precursor to be combusted with the reagent (or reagent mixture) is introduced, with the precursor including silicon. Via IR radiation from an IR radiation source, the IR radiation having a wavelength of about 2.5-3.5 microns distributed substantially two-dimensionally, at least a portion of the reagent (or reagent mixture) and the precursor are combusted to form a combusted material, the combusted material comprising non-vaporized material. The glass substrate is provided in an area about 2-5 mm from IR radiation source so that the glass substrate is heated sufficiently to allow the combusted material to form the coating substantially uniformly, directly or indirectly, on the glass substrate. The coating is substantially uniform.

In certain example implementations, the substrate temperature is heated to a temperature lower than that of conventional CVD and/or a lower temperature flame is used to combust the material to be combusted. In certain example implementations, the coating may be applied in a substantially uniform manner (e.g., across two dimensions), as measured by variations in thickness of the coating (e.g., with variations not exceeding about ±10%) and/or variations in the visible transmission gain (e.g., with variations in either percent transmission or percent transmission gain not exceeding about ±0.5%).

In addition to these example embodiments, the inventor of the instant application also has been able to create a remote combustion deposition burner in which the precursor is delivered along with a carrier gas stream to the reaction zone external to the flame. In brief, a distribution device provided in connection with certain example burner configurations provides an at least initially substantially laminar flow of a gaseous stream comprising the precursor and the carrier gas, which ultimately is substantially uniform across the coat zone. Thus, certain example embodiments realize at least some the benefits of infrared (IR) burner deposition described herein, as well as advantages more specific to using remote combustion deposition techniques including, for example, reduced heat flux to the substrate, reduced fuel consumption, possible enhanced reaction control and ability to use moisture/oxygen sensitive precursors to deposit coatings (as precursor can be delivered in inert carrier gas), and/or the like.

In certain example embodiments of this invention, a remote combustion deposition system for use in combustion deposition depositing a coating on a substrate is provided. An infrared (IR) burner is configured to generate radiant energy in an area between the burner and the substrate. A delivery device is configured to provide a stream comprising a substantially vaporized precursor and a carrier gas from a location that is remote from the radiant energy generated by the IR burner. The delivery device is further configured to cause the stream to flow between the substrate and the IR burner. In operation, the stream is substantially laminar when exiting the delivery device and, in operation, the radiant energy is sufficient to cause the precursor in the stream to be combusted and to heat the substrate to allow at least a portion of the combusted precursor to form the coating, directly or indirectly, on the substrate.

In certain example embodiments, a method of forming a coating on a glass substrate using combustion deposition is provided. A glass substrate having at least one surface to be coated is provided. At least one infrared (IR) burner is provided. A substantially laminar flow of a gaseous stream comprising a precursor and a carrier gas is provided, with the stream at least initially being provided remote from the IR burner. The stream is caused to pass between the substrate and the at least one IR burner. Using the at least one IR burner, at least a portion of the precursor in the stream is combusted to form a combusted material, with the combusted material comprising non-vaporized material. The glass substrate is provided in an area so that the glass substrate is heated sufficiently to allow the combusted material to form the coating, directly or indirectly, on the glass substrate.

Certain example embodiments also relate to methods of making coated articles in accordance with these and/or other example implementations.

The features, aspects, advantages, and example embodiments described herein may be combined to realize yet further embodiments.

BRIEF DESCRIPTION OF THE DRAWINGS

These and other features and advantages may be better and more completely understood by reference to the following detailed description of exemplary illustrative embodiments in conjunction with the drawings, of which:

FIG. 1b is an enlarged view of the holes in the typical linear burner of FIG. 1a;

DETAILED DESCRIPTION OF EXAMPLE EMBODIMENTS OF THE INVENTION

In certain example embodiments of this invention, a method of forming a coating on a glass substrate using combustion deposition is provided. A glass substrate having at least one surface to be coated is provided. A reagent and an optional carrier medium are selected, and the reagent and the carrier medium are mixed together to form a reagent mixture. The reagent is selected such that at least a portion of the reagent is used in forming the coating. A precursor to be combusted with the reagent mixture is introduced. Using at least one infrared burner, at least a portion of the reagent mixture and the precursor are combusted to form a combusted material, with the combusted material comprising non-vaporized material. The glass substrate is provided in an area so that the glass substrate is heated sufficiently to allow the combusted material to form the coating, directly or indirectly, on the glass substrate. The coating may be applied in a substantially uniform manner (e.g., across two dimensions), as measured by variations in thickness of the coating and/or variations in other coating properties (e.g., density, refractive index, etc.). In the case of depositing a SLAR coating comprising silicon oxide, the coating may increase visible transmission of the glass substrate by at least about 1.7%.

In certain example embodiments, a fuel gas and oxygen source are selected and mixed together to form a combustion gas mixture. At least a portion of the combustion gas mixture is used in forming the coating. A precursor is selected such that at least a portion of the combustion products form a coating with desired properties. The precursor is introduced into the combustion gas stream to form a reagent mixture. Using at least one infrared burner, at least a portion of the reagent mixture is reacted via combustion to form reaction products, with at least a portion of the reaction products comprising non-vaporized material.

As noted above, it would be advantageous to deposit single layer anti-reflective (AR) coatings on glass substrates, for example, to increase the visible transmission of the glass substrates that mitigate one or more of the above and/or other disadvantages associated with conventional combustion deposition techniques. Thus, certain example embodiments implement an alternative type of burner as an in heat management during coating deposition in the overall combustion deposition process. In certain example embodiments, the alternative burner is an infrared (IR) burner. For example, an IR burner manufactured by the Maxon Corporation under the trade name RadMax (Type 13) may be used in connection with certain example embodiments.

The IR burner of certain example embodiments operates with very little visible flame, and sometimes even no visible flame at all in certain example embodiments, as most of the combustion process takes place within the body of the burner above the refractory faceplate. The burner irradiates infrared wavelength radiation from the burner faceplate that is heated by the combustion process. It will be appreciated that as the heater surface temperature increases, the wavelength of the radiant energy generated decreases. To increase the efficiency from the radiant heater, a wavelength of infrared that will be absorbed by the product to be heated may be used.

More precisely, the IR burner shifts the radiation emission towards the IR region. The combustion process heats the face plate surface which emits IR as function of temperature. In general, the hotter the faceplate the shorter the wavelength. The range of wavelengths possible extends from about 2 microns to about 11 microns and, more particularly, from about 2.5-3.5 microns. This corresponds to an emitter surface temperature range of from about 500° C.-900° C. Generally the wavelength is selected based upon the absorption of the materials to be heated. For example, a first range for wavelengths of infrared that tends to be most readily absorbed by water includes radiation from about 5.3-7 microns, corresponding to an emitter surface temperature range from about 140-270° C. A second range is from about 2.55-2.9 microns, corresponding to an emitter surface temperature range from about 720-870° C. Of course, it will be appreciated that the wavelengths and/or emitter surface temperatures may be adjusted, for example, in dependence on the reagents, solutions, precursors, etc., so as to increase efficiency of the coating process.

The IR burner comprises a sintered metal or ceramic face plate. The advantages associated with using a sintered metal or ceramic face plate are described in greater detail below. In general, IR burners have been found to distribute heat over a much larger area than linear burners. For example, the Maxon IR burner identified above has been an operating combustion area of 7.7 cm wide by 37.7 cm long. Thus, the deposition occurs substantially two-dimensionally, which can be contrasted with the conventional linear burner technique where the burner most typically may be 2 cm wide×30 cm long. Although the number of rows of holes used in a linear burner theoretically could be increased to provide more two-dimensional deposition, the amount of heat introduced to the substrate likely would be too high, and thus certain substrates would not survive the coating process (for example, if hole size is maintained and rows are expanded, then the flow rate would have to be increased to maintain the flame and prevent flashback, which would lead to higher substrate temperatures; and if the hole size is decreased as rows increase such that the total flow area remains roughly constant, then the flow rate could be kept the same and flame characteristics may begin to approach that of an IR burner although the burner would no longer be linear). With this particular example configuration, two or more IR burner modules may be used simultaneously to fit the control system limitations of the particular gas train unit, for example, in terms of overall combustion gas flow rate. However, it will be appreciated that the present invention is not so limited. Indeed, a gas train could be configured that would enable the use flow rates such that any reasonable number of burners or burner designs could be used. Thus, by way of example and without limitation, a single IR burner module may have a width of about 1.5-3.7 m in certain example embodiments, thereby reducing the need for multiple IR burner modules.

Similar to the conventional linear burners, the IR burner of certain example embodiments also uses a premixed combustion gas (e.g., comprising propane and air). However, the amount of fuel required to successfully operate the IR burner of certain example embodiments is lower than the conventional linear burner. In particular, the stable operating window for the IR burner of certain example embodiments involves air flow rates preferably of about 100-350 SLM and more preferably about 125-325 SLM. Similarly, the preferable air-to-propane ratios are about 15-35 and more preferably 20-30.

Silicon oxide (e.g., $SiO_2$ or other suitable stoichiometry) films made with the IR burner of certain example embodiments may use the precursor hexamethyldisiloxane (HMDSO). Other precursors, such as tetraethylorthosilicate (TEOS), silicon tetrachloride (e.g., $SiCl_4$ or other suitable stoichiometry), and the like, may be used. Of course, it will be appreciated that other metal oxide precursors may be used, for example, as the invention is not limited to deposition of silicon dioxide films.

Advantageously, successful coatings with the IR burner of certain example embodiments may be provided using much smaller burner-to-lite distances than that of many conventional linear burners (e.g., although linear burners have tried using smaller burner-to-substrate gaps to deposit coatings, at these distances with certain substrates (e.g., glass substrates), the even higher temperatures and larger temperature gradients involved at these distances are problematic). The distances used in connection with the IR burner of certain example embodiments preferably are within the range of about 1-7 mm and more preferably about 2-5 mm. Also advantageous is that the heat flux produced during coating is much lower with the IR burner. It will be appreciated that burner-to-lite distance impacts films. For example, larger burner-to-lite distances result in powders be generated rather than films.

In one example, the process conditions for successfully producing films using two IR burners simultaneously involved a burner air flow of 175 SLM, an air-to-propane ratio of 24, four passes (with two burners per pass), a burner-to-lite distance of 3 mm, and a glass substrate velocity of 50 mm/sec, with an HDMSO concentration of 0.018%.

Using these process conditions, the back side of the substrate reached a temperature of only 111° C. This equates to a linear estimate of temperature rate of rise of 16.5° C./burner/m/min, which is nominally 25% of the rate of rise observed with the linear burner. Accordingly, there is also a corresponding reduced heat flux per unit area. In certain example embodiments, the IR burner may be tuned such that the visible flame is reduced in size and thermal gradients generally are only evident by visible variations in gas density.

Using the above described techniques, the combusted material forming on the glass substrate (either directly or indirectly) comprises at least some particulate matter. That is, at least some of the combusted material to be deposited on the surface of the substrate is non-vaporized material. The presence of some particulate matter was detected by measuring the haze value of the glass before and after wiping the glass substrate. Additionally, some particulate matter is embedded into the film. It will be appreciated that the amount and size distribution of particulate matter hitting the substrate may be reduced, for example, by reducing the concentration of precursor in the flame. However, it also would be appreciated that this process would be too slow for practical manufacturing purposes. Thus, in certain example embodiments, following deposition of the material onto the substrate, the substrate may be wiped and/or washed in a cleaning process to reduce the particulate matter formed on the substrate that is not continuous with the film.

As noted above, using a sintered metal or ceramic faceplate in connection with the IR burners of certain example embodiments is advantageous. For example, using a sintered metal or ceramic faceplate in connection with the IR burners enables the coating to be provided in a substantially uniform distribution, e.g., in two dimensions on the glass substrate. The uniformity of the distribution may be measured, for example, in terms of uniformity of thickness and/or visible transmission. Preferably, the thickness of the coating will vary by no more than about ±15%, more preferably by no more than about ±10%, and still more preferably no by more than about ±5%. For optical coatings, preferably, the visible transmission will vary by no more than ±2%, more preferably by no more than about ±1%, and still more preferably by no more than about ±0.5%.

In terms of the actual thickness of the deposited coating, most deposited optical single-layer AR coatings of silicon oxide will be within the range of about 80-120 nm. More preferably, most coatings deposited will be about 100 nm thick. Of course, there are many other materials that may be used for coatings for similar and/or other product applications. The example embodiments described herein may be used to boost the visible transmission preferably by about 1.7%, more preferably by about 2.5%, and still more preferably by at least about 3.0%. In certain example embodiments, the coatings may be applied to one or both sides of the glass substrate. Thus, providing coatings conveying 3.0% visible transmission gains to both sides of a clear float glass substrate with a base visible transmission of about 91% advantageously may result in a total visible transmission of about 97%. Of course, the present invention is not limited to the dual-side coating, the use in connection with clear float glass, or the 3.0% visible transmission gain of the coating, or silicon dioxide films.

Certain example embodiments also may provide enhanced AR features by reducing the index of refraction of the silicon dioxide coating, e.g., so as to create a voided film through the introduction of more air. Bulk silicon dioxide typically has an index of refraction of from about 1.45-1.50. Certain example embodiments may reduce the index of refraction of the films to about 1.40, more preferably to about 1.35-1.38, and still more preferably to about 1.30-1.33 or even lower.

Figure 3:
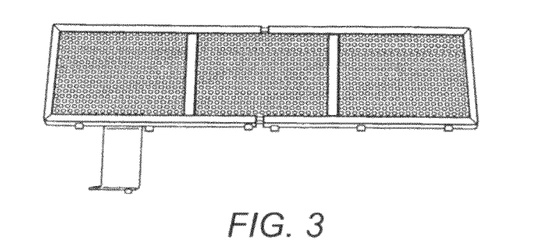
FIG. 3 shows a typical IR burner module that may be used to carry out combustion deposition in accordance with an example embodiment.
Figure 4:
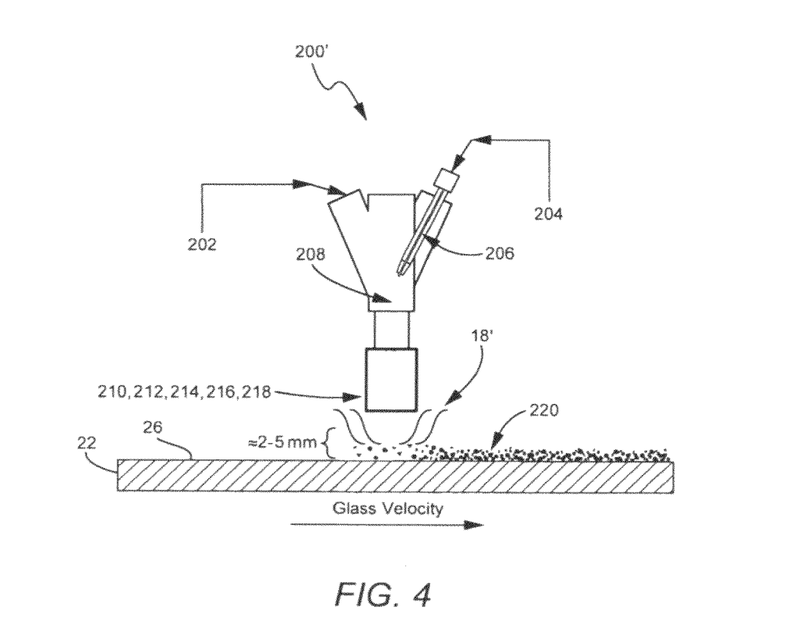
FIG. 4 is a simplified view of an improved apparatus including an infrared burner used to carry out combustion deposition in accordance with an example embodiment.

FIG. 3 shows a typical IR burner module that may be used to carry out combustion deposition in accordance with an example embodiment. FIG. 4 is a simplified view of an improved apparatus 200' including an infrared burner used to carry out combustion deposition in accordance with an example embodiment. The improved apparatus 200' shown in FIG. 4 is similar to the apparatus 200' shown in FIG. 2, except that the improved apparatus 200' includes an IR burner (e.g., one or more of the IR burner modules shown in FIG. 3). Thus, radiant energy 18' performs the coating, and the existence of a visible flame is reduced. The surface 26 of the substrate 22 to be coated is located much closer to the apparatus. For example, in FIG. 4, the surface 26 of the substrate 22 to be coated is located only about 2-5 mm from the apparatus. Accordingly, the reaction steps 210-218 occur within a much smaller distance. Additionally, the improved apparatus 200' is configured to provide a substantially two-dimensional coating area, which is substantially uniform.

Figure 5:
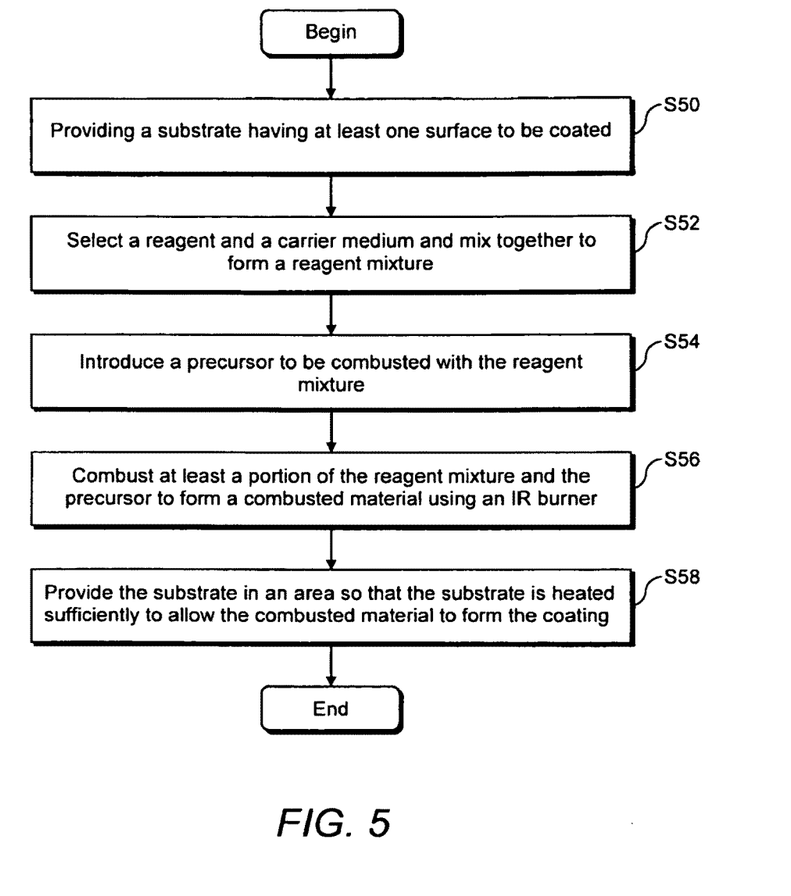
FIG. 5 is an illustrative flowchart illustrating a process for applying a single layer anti-reflective coating to a glass substrate using combustion deposition using an infrared burner in accordance with an example embodiment.

FIG. 5 is an illustrative flowchart illustrating a process for applying a single layer anti-reflective coating to a glass substrate using combustion deposition using an infrared burner in accordance with an example embodiment. In step S50, a substrate (e.g., a glass substrate) having at least one surface to be coated is provided. A reagent and a carrier medium are selected and mixed together to form a reagent mixture in step S52. The reagent is selected so that at least a portion of the reagent forms the coating. A precursor to be combusted with the reagent mixture is introduced in step S54. In step S56, at least a portion of the reagent mixture and the precursor are combusted using an IR burner, thereby forming a combusted material. The precursors may be introduced by a number of means. For example, the precursors may be introduced in a vapor state via a bubbler or other vaporization device, as large particle droplets via an injector, and/or as small particle droplets via a nebulizer. The combusted material comprises non-vaporized material (e.g., at least some particulate matter). In step S58, the substrate is provided in an area so that the substrate is heated sufficiently to allow the combusted material to form the coating on the substrate. The coating may be formed either directly or indirectly on the substrate. Optionally, in a step not shown, the opposing surface of the substrate also may be coated. Also optionally, the substrate may be wiped and/or washed, e.g., to remove excess particulate matter deposited thereon.

The example techniques described herein are advantageous for several reasons. For example, the IR burners of certain example embodiments reduce the substrate temperatures during deposition, which leads to a reduced amount of changes in the glass stress, and/or a reduced propensity for the glass to break during deposition and/or in post-coating processing. As alluded to above, too much heat may lead to breakage and/or deformation of the glass substrate (e.g., causing the glass substrate to deform in a convex up or concave down manner), caused in part by residual stresses left in glass. In a similar vein, the heat flux from the IR burners of certain example embodiments may be distributed across a much larger area, thereby reducing the thermal gradients that lead to stress-induced glass fracture. Additionally, certain example embodiments provide the ability to increase the separation of the substrate temperature effect from the combustion process on film growth processes at the substrate surface. Reducing the coupling of the substrate temperature to the combustion reactor process, in turn, may provide improved ability for process control and may also result in less variable film performance.

Furthermore, because the IR burners of certain example embodiments require less fuel, fuel usage costs may be reduced. There also may be reduced post-deposition glass cooling costs (e.g., because the substrate does not become as hot, because fewer substrates are lost because of breakage and/or deformation, etc.). The flames produced by the IR burners of certain example embodiments tend to be more uniform than with the linear burner, as observed by the reduced amount of visible movement in the combustion zone. Finally, the IR burners of certain example embodiments may be more easily maintained because the design allows for easy disassembly and cleaning. It will be appreciated that maintainability often is a component of the burner design for the manufacturability of combustion deposition coating applications.

As indicated above, the inventor of the instant application also has been able to create a remote combustion deposition burner in which the precursor is delivered along with a carrier gas stream to the reaction zone external to the flame. Indeed, certain example embodiments relate to the deposition of thin film coatings (e.g., metal, metal oxide, and/or other thin film coatings) using an infrared (IR) burner in connection with remote combustion deposition. In certain example embodiments, the precursor material is passed between the IR burner and the substrate, from a source and along a path that at least initially is remote from any flames or radiant energy sources. The precursor thus is not fed to the burner in a premixed reagent stream. Instead, in certain example embodiments, the precursor is delivered to the reaction zone in a carrier gas stream from a source along a path that at least initially is external to the flame and in an area proximate to IR radiant energy caused by the IR burner.

In certain example embodiments, the precursor may be delivered in a vapor state in an inert carrier gas stream. One example of a typical inert carrier gas is nitrogen, although any inert gas may be used. Of course, a non-inert gas such as, for example, oxygen, also may be used in connection with certain example embodiments. In any event, a gaseous stream comprising the precursor and the carrier gas may be passed through a distribution device which, in turn, may use an effect based on the Bernoulli principle such as, for example, the Coanda effect, to produce a substantially laminar flow of gas across the surface of the glass substrate.

In certain example embodiments, the precursor may not be completely vaporized and, thus, in certain example embodiments, it may include at least some particulate matter. The precursor may be at least partially vaporized using any appropriate mechanism including, for example, a nebulizer, bubbler, etc.

It will be appreciated that the substantially laminar flow will exist as the gaseous stream comprising the precursor and the carrier gas exits the distribution device. As is known, a laminar flow (also sometimes referred to as a streamlined flow) relates to a "smooth" (as opposed to turbulent) flow that generally occurs when a fluid flows in parallel layers, with no disruption between the layers. It will be appreciated that the flow of the gaseous stream will become "less laminar" as it exits the distribution device and moves across the surface of the substrate to be coated. Notwithstanding this "spreading out" of the gaseous stream, certain example embodiments may provide for a substantially uniform flow at least across the coat zone. A substantially uniform flow is advantageous, in that a non-uniform flow may cause striations in the coating or stripe patterns to be formed.

The tolerance level for the uniformity of the gaseous stream across the coat zone has been found to vary based on the material to be coated, the flow rate, etc. However, a flow that is at least 80% uniform generally will be acceptable. A flow that is 85% uniform is more advantageous, and a flow that is 90% uniform is yet more advantageous. In certain example embodiments, depending on the conditions, it is possible to achieve a flow that is 95% (or more) uniform, which is still more advantageous.

Figure 7:
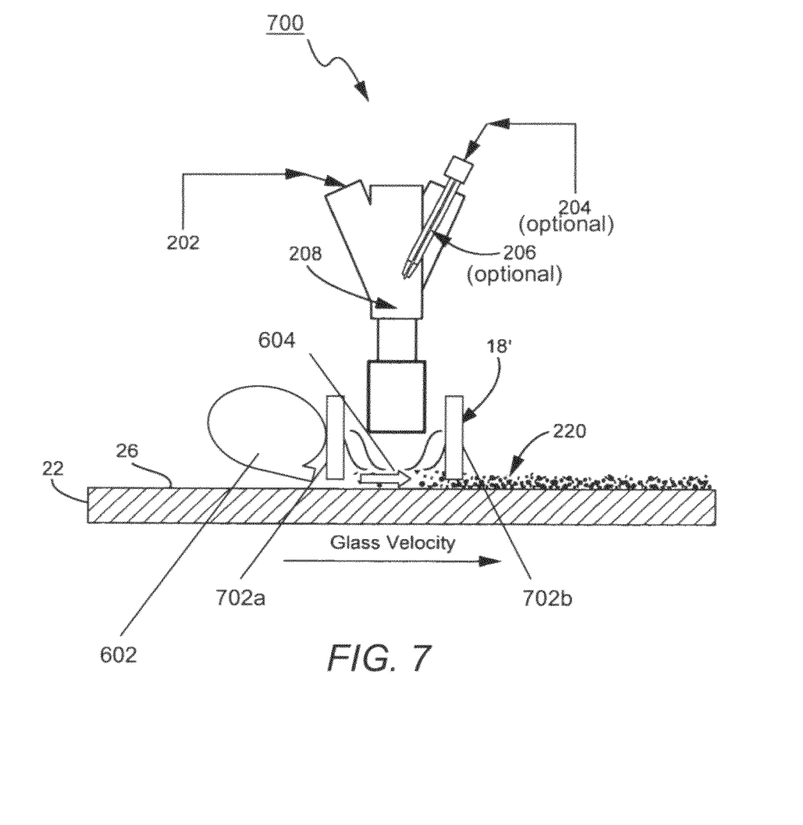
FIG. 7 is a simplified view of another remote combustion deposition apparatus in accordance with an example embodiment.

In certain example embodiments, baffling may be provided so as to help control the flow across the region between the burner and the glass. Such baffling may be provided adjacent to the distribution device. In certain example embodiments, such baffling may in addition or in the alternative be provided proximate to the baffling and/or around the coat zone. For instance, the FIG. 7 example embodiment includes first and second baffles 702a and 702b around the combustion zone, e.g., on exterior sides of the flame or radiant energy 18'. These baffles 702a and 702b may reduce the impact of the external environment on the flow of gas from the distribution device 602 and/or reduce the likelihood of other disturbances that might create non-uniformities in the flow from the distribution device 602. They also may serve as heat refractories.

In certain example embodiments, the distribution device or a portion thereof (e.g., such as an outlet nozzle, etc.) may be caused to oscillate, e.g., in lateral directions. This may sometimes help reduce the likelihood of striations forming.

The remote combustion deposition techniques disclosed herein may produce particulate matter in certain example implementations. At least some of this particulate matter may be incorporated into the coating. In other words, in certain example implementations, a mixture of vapor and particulate matter may be used in forming the coating. This has been found to be the case, for example, with titanium oxide (e.g., $TiO_2$ or other suitable stoichiometry) and silicon oxide (e.g., $SiO_2$ or other suitable stoichiometry) coatings.

Figure 6:
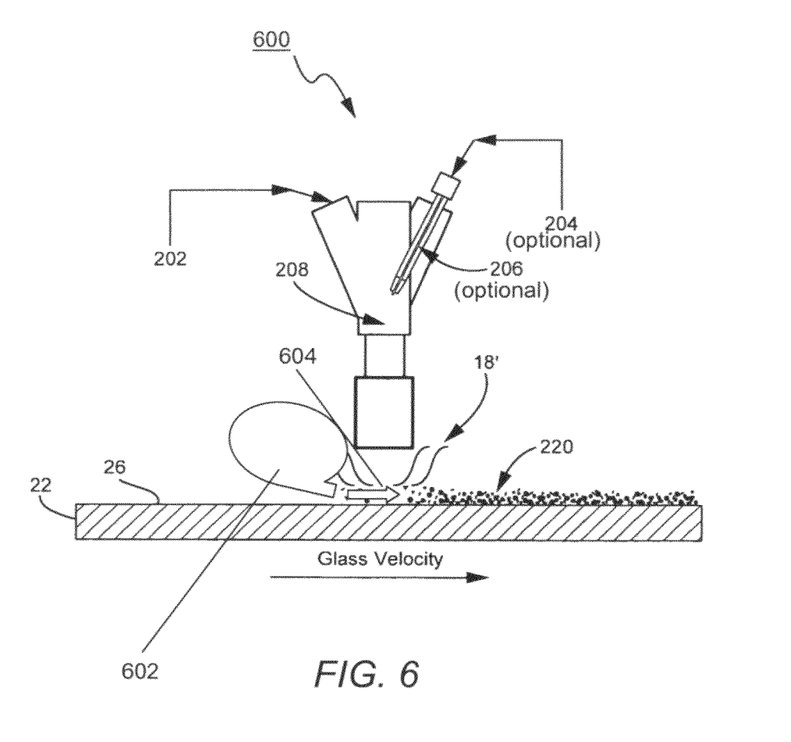
FIG. 6 is a simplified view of a remote combustion deposition apparatus in accordance with an example embodiment.

FIG. 6 is a simplified view of a remote combustion deposition system 600 in accordance with an example embodiment. The remote combustion deposition apparatus 600 is similar to apparatus 200' shown in FIG. 4. However, the system 600 includes a distribution device 602. This distribution device 602 provides the substantially laminar flow of the gaseous stream 604, which comprises the precursor and the carrier gas. As will be appreciated from FIG. 6, the gaseous stream 604 is provided from a source and along a path that at least initially is remote from the flame or radiant energy 18'. Indeed, the gaseous stream 604 is provided between the "flame" and the surface 26 of the substrate 22 to be coated.

The FIG. 6 example embodiment shows an optional precursor 204 and insertion mechanism 206. However, because the precursor is primarily delivered through the distribution device 602 in the FIG. 6 remote combustion deposition example embodiment, the precursor insertion mechanism 206 (and/or corresponding precursor to be delivered) may not be used. In certain example embodiments, the insertion mechanism 206 and surrounding structure may not be provided, at all.

In addition, the characteristics of the precursor reaction zone in FIG. 6 (e.g., under the face of the burner and proximate to the radiant energy 18') may be different from those of the precursor reaction zones in FIG. 2 and FIG. 4. For instance, the reaction zone in FIG. 6 may be shorter and wider, as the gaseous stream is provided closer to the substrate and from a source and along a path that is at least initially remote from the flame or radiant energy 18' in the FIG. 6 example embodiment. The location of the chemical reaction area (e.g., where reduction, oxidation, and/or the like may occur), nucleation area, coagulation area, and agglomeration area also may be different. Of course, it will be appreciated that more or fewer flames or sources of radiant energy may be provided in connection with different embodiments of this invention, which may help define more or fewer reaction zones. In certain example embodiments, the flames or radiant energy sources may form a single flame or radiant energy front and, in certain example embodiments, the gaseous stream comprising the carrier gas and the precursor may be provided between this single flame or radiant energy front and the glass substrate.

The distribution device 602 itself may be any device capable of at least initially producing a substantially laminar flow of the gaseous stream 604 comprising the precursor and the carrier gas. For example, in certain example embodiments, the distribution device 602 may be an air knife similar to those found in "air knife coaters" typically used for liquid coatings. Black Clawson Limited and Peer Paper Machines Pvt. Ltd. provide air knife coaters that include air knives similar to those that may be used in connection with example embodiments of this invention. The air knives in these systems help to smooth the surface of applied liquid coatings to achieve a more uniform final product. As is known, an air knife is a tool that often is used to blow liquid or debris from products travelling on conveyors. The knife typically operates as a high intensity, substantially uniform sheet of substantially laminar airflow. An air knife device typically includes a pressurized air plenum containing a series of holes or continuous slots through which pressurized air exits in a substantially laminar flow pattern. Of course, it will be appreciated that the flow rate may depend, for example, on the precursor material, desired characteristics of the final coating, flame temperature, etc.

It will be appreciated that the distribution device 602 may be a device that includes a manifold with a slit outlet for the precursor and carrier gas, provided that such a device can generate a substantially laminar flow and can withstand heat radiating from the burner(s). Also, as indicated above, the distribution device 602 may be stationary or it may be movable in different example implementations. In example implementations where the distribution device 602 is movable, it may, for example, reciprocate, rotate, oscillate, etc.

The FIG. 6 example embodiment shows the distribution device 602 being provided at an edge of the apparatus. However, it will be appreciated that the distribution device 602 may be provided upstream or downstream of the burner(s) as the substrate moves along an assembly line in different embodiments of this invention. In addition, in certain example embodiments, the distribution device 602 may be provided between two adjacent burners, provided that the gaseous stream including the precursor and carrier gas is at least initially provided in a substantially laminar flow between the burner(s) and the substrate to be coated.

Certain remote combustion deposition example embodiments may use process conditions and/or parameters that are the same as or similar to those specified above with respect to the non-remote IR burner combustion deposition embodiments. For example, the flow rate out of the IR burner may be the same as or similar to the above. However, it will be appreciated that the flow rate may be reduced below the ranges specified in certain example embodiments, e.g., to 75-125 SLM in certain example embodiments. Lowering the flow rate may be advantageous in that it may reduce the potential impact on the stream comprising the precursor and the carrier gas.

In certain example embodiments, an air-to-propane ratio of 21-30, more preferably 25-28, is provided. The distance between the face of the IR burner and the substrate in certain example embodiments may be 2-20 mm, more preferably 5-10 mm.

In addition to some or all of the above-described advantages associated with the other example combustion deposition techniques presented herein, the remote combustion deposition example embodiments may provide further benefits. For example, the remote combustion deposition example embodiments may result in a reduction of the heat flux proximate to or received by the substrate. As another example, fuel consumption may be reduced. As still another example, the remote combustion deposition example embodiments may provide for enhanced reaction control and/or the ability to use moisture and/or oxygen sensitive precursors in depositing coatings, as such a precursor is deliverable in or along with an inert carrier gas.

It will be appreciated that while a layer or coating is "on" or "supported by" a substrate (directly or indirectly), other layer(s) may be provided therebetween. Thus, for example, a coating may be considered "on" and "supported by" the substrate even if other layer(s) are provided between the growth and the substrate. Moreover, certain growths or layers of a coating may be removed in certain embodiments, while others may be added in other embodiments of this invention without departing from the overall spirit of certain embodiments of this invention.

It will be appreciated that the techniques described herein can be applied to a variety of metals and metal oxides, and that the present invention is not limited to any particular type of metal/metal oxide deposition and/or precursor. For example, oxides of the transition metals and lanthanides such as, for example, Y, Ti, Zr, Hf, V, Nb, Ta, Cr, Mo, W, La, Ce, Cr, Mo, W, Mn, Fe, Ru, Co, Ir, Ni, Cu, and main group metals and metalloids such as, for example, Zn, Cd, B, Al, Ga, In, Si, Ge, Sn, Sb and Bi, and mixtures thereof can all be deposited using the techniques of certain example embodiments. As another example, metallic silver and tin may also be deposited using the techniques described herein.

It will be appreciated that the foregoing list is provided by way of example. For example, the metal oxides identified above are provided by way of example. Any suitable stoichiometry similar to the metal oxides identified above may be produced. Additionally, other metal oxides may be deposited, other precursors may be used in connection with these and/or other metal oxide depositions, the precursor delivery techniques may be altered, and/or that other potential uses of such coatings may be possible. Still further, the same or different precursors may be used to deposit the same or different metal oxides for a metal oxide matrix coating and/or embedded nano-particles.

Also, it will be appreciated that the techniques of the example embodiments described herein may be applied to a variety of products. That is, a variety of products potentially may use the AR films alluded (e.g., using the same or different process conditions) to above and/or other AR films, depending in part on the level of transmission gain that is obtained. Such potential products include, for example, photovoltaic, green house, sports and roadway lighting, fireplace and oven doors, picture frame glass, etc. Non-AR products also may be produced. For example, $TiO_2$ films may be deposited or heat treated to produce the anatase crystalline phase, which typically is photocatalytic and may be used, for instance, in "low maintenance glass" product and/or applications.

The example embodiments described herein may be used in connection with other types of multiple layer (e.g., multilayer AR) coatings, as well. By way of example and without limitation, multiple reagents and/or precursors may be selected to provide coatings comprising multiple layers.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method of forming a coating on a glass substrate using combustion deposition, the method comprising:
   providing a glass substrate having at least one surface to be coated;
   providing at least one infrared (IR) burner;
   providing a substantially laminar flow of a gaseous stream comprising a precursor and a carrier gas, the stream at least initially being provided remote from the IR burner;
   causing the stream to pass between the substrate and the at least one IR burner;
   combusting, using the at least one IR burner, at least a portion of the precursor in the stream to form a combusted material, the combusted material comprising non-vaporized material; and providing the glass substrate in an area so that the glass substrate is heated sufficiently to allow the combusted material to form the coating, directly or indirectly, on the glass substrate.

2. The method of claim 1, wherein the flow of the gaseous stream is substantially uniform during the combusting.

3. The method of claim 1, wherein the stream is provided via a delivery device comprising a manifold with a slit outlet through which the stream is to pass.

4. The method of claim 1, wherein the stream is provided via an air knife.

5. The method of claim 3, further comprising causing the delivery device to oscillate to reduce non-uniformities and/or striping in the coating.

6. The method of claim 1, further comprising providing the substrate at a distance of about 2-20 mm from the at least one IR burner.

7. The method of claim 1, further comprising providing IR radiation at a wavelength of about 2.5-3.5 microns to cause the combusting.

8. The method of claim 1, further comprising providing fuel at an air flow rate of about 75-125 standard liters per minute.

9. The method of claim 1, wherein baffles at least partially surround a location in which the combusting occurs.

10. A method of making a coated article comprising a coating supported by a glass substrate, the method comprising:

provide a glass substrate having at least one surface to be coated;

providing at least one infrared (IR) burner;

providing a substantially laminar flow of a gaseous stream comprising a precursor and a carrier gas, the stream at least initially being provided remote from the IR burner;

causing the stream to pass between the substrate and the at least one IR burner;

combusting, using the at least one IR burner, at least a portion of the precursor in the stream to form a combusted material, the combusted material comprising non-vaporized material; and providing the glass substrate in an area so that the glass substrate is heated sufficiently to allow the combusted material to form the coating, directly or indirectly, on the glass substrate.

* * * * *